(12) United States Patent
Yao

(10) Patent No.: US 11,217,719 B2
(45) Date of Patent: *Jan. 4, 2022

(54) CONDUCTIVE ISOLATION BETWEEN PHOTOTRANSISTORS

(71) Applicant: WAVEFRONT HOLDINGS, LLC, Basking Ridge, NJ (US)

(72) Inventor: Jie Yao, Plainsboro, NJ (US)

(73) Assignee: WAVEFRONT HOLDINGS, LLC, Basking Ridge, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/558,957

(22) Filed: Sep. 3, 2019

(65) Prior Publication Data

US 2020/0006591 A1 Jan. 2, 2020

Related U.S. Application Data

(63) Continuation of application No. 15/467,478, filed on Mar. 23, 2017, now Pat. No. 10,453,984.

(51) Int. Cl.
*H01L 31/00* (2006.01)
*H01L 31/11* (2006.01)
*H01L 27/146* (2006.01)

(52) U.S. Cl.
CPC ........ *H01L 31/1105* (2013.01); *H01L 27/146* (2013.01); *H01L 27/1463* (2013.01); *H01L 27/14603* (2013.01); *H01L 27/14609* (2013.01); *H01L 27/14694* (2013.01)

(58) Field of Classification Search
None
See application file for complete search history.

(56) References Cited

U.S. PATENT DOCUMENTS

| | | | |
|---|---|---|---|
| 3,617,823 A | 11/1971 | Hofstein | |
| 3,653,898 A | 4/1972 | Shaw | |
| 4,620,210 A | 10/1986 | Scavennec | |
| 4,658,282 A | 4/1987 | Matzen, Jr. | |
| 5,128,735 A * | 7/1992 | Ohmi | H01L 27/14681 250/208.1 |
| 5,712,685 A * | 1/1998 | Dumas | H04N 5/349 348/219.1 |
| 7,202,102 B2 | 4/2007 | Yao | |
| 10,453,984 B2 * | 10/2019 | Yao | H01L 27/1463 |
| 2010/0237455 A1 | 9/2010 | Lee | |
| 2011/0291158 A1 | 12/2011 | Ogura et al. | |

OTHER PUBLICATIONS

Notice of Allowance issued in U.S. Appl. No. 15/608,685 dated Jan. 30, 2018.
S.M. Sze et al., "Chapter 13: Photodetectors and Solar Cells", Physics of Semiconductor Devices, 3rd Edition, 2007, pp. 663-742.

* cited by examiner

*Primary Examiner* — Reema Patel
(74) *Attorney, Agent, or Firm* — Pillsbury Winthrop Shaw Pittman LLP

(57) ABSTRACT

Disclosed are phototransistors, and more specifically a detector that includes two or more phototransistors, conductively isolated from each other. Embodiments also relate to methods of making the detector.

17 Claims, 20 Drawing Sheets

CONDUCTIVE ISOLATION BETWEEN PHOTOTRANSISTORS

CROSS-REFERENCE TO RELATED APPLICATIONS

This application is a continuation of U.S. patent application Ser. No. 15/467,478, filed on Mar. 23, 2017, which is hereby expressly incorporated by reference in its entirety.

STATEMENT REGARDING FEDERALLY SPONSORED RESEARCH OR DEVELOPMENT

This invention was made with Government support under SBIR contract M67854-14-C-6530 awarded by the U.S. Department of Defense. The Government has certain rights in the invention.

BACKGROUND

1. Field of the Embodiments

The embodiments relate to phototransistors, and more specifically to a detector that includes two or more phototransistors, conductively isolated from each other. Embodiments also relate to methods of making the detector.

2. Background Discussion

A phototransistor generates an output current dependent on the flux of incident light. Photons absorbed in a phototransistor generate electron-hole pairs collected by p-n junctions. Minority carriers collected by the p-n junctions operate as a base current. The base current is amplified based on a bipolar transistor gain, thereby generating a collector current. The very small number of photo generated carriers, depending on the location of origin, can either flow to the emitter and reduce the emitter current or flow to the collector to enhance the collector current. An emitter current or the collector current is generally used as an output current. Conventional phototransistors and their use in sensors are disclosed in, for example, U.S. Patent Application Publication No. 2010/0237455; and S. M. Sze and Kwok K. Ng, "Physics of Semiconductor Devices", 3rd edition, Wiley Interscience, John Wiley & Sons, Inc., 2007, ISBN-13: 978-0-471-14323-9, ISBN-10: 0-471-14323-5. Chapter 13 "Photodetectors and Solar Cells", Section 13.5 "Phototransistors", pp. 694-697, the disclosures of which are incorporated by reference herein in their entirety

SUMMARY

Electrical isolation between neighboring circuit elements, including transistors, are typically achieved by structures of high electrical resistivity sandwiched between the neighboring circuit elements. Disclosed herein is an electrically conductive isolation structure between phototransistors (PT), and methods for fabricating the same. A bipolar junction transistor (BJT) can be configured in a common-emitter configuration when its input signal and output signal share the same common emitter electrode; a BJT also can be configured in a common-base configuration when its input signal and output signal share the same common base electrode. The collector of a BJT is typically an output electrode, and hence not shared with the input. The electrically conductive isolation between PTs disclosed in this invention configures the PTs in a common-collector circuit, wherein the PTs share the same common collector electrode.

It is a feature of an embodiment to provide a detector and method for making a detector in which the detector may contain two or more than two transistors, each transistor being isolated from the other. In one embodiment, a detector includes a dielectric, a first phototransistor (PT) and a second PT, each PT comprising an emitter, a collector, and a floating base. There may be a p-n junction positioned between the emitter and the floating base (E-B junction) of each PT, whereby the E-B p-n junction is in direct contact with and encapsulated by the emitter, the floating base, and the dielectric. There may be a p-n junction positioned between the floating base and the collector (B-C junction) of each PT, whereby the B-C p-n junction may be in direct contact with and encapsulated by a combination of the floating base, the collector, and the dielectric. The floating base may be in direct contact with and encapsulated by the E-B junction, the B-C junction and the dielectric. The collectors of each PT (e.g., first PT and second PT if there are two) can be joined together as a joined collector.

It also is a feature of an embodiment that a combination of the E-B junction, the base and the B-C junction of the detector be in direct contact only with and completely encapsulated only by a combination of the emitter, the collector and the dielectric. Another embodiment of the detector includes one in which the emitter of the first PT and the emitter of the second PT are separate from one another, the E-B junction of the first PT and the E-B junction of the second PT are separate from one another, the base of the first PT and the base of the second PT are separate from one another, and the B-C junction of the first PT and the B-C junction of the second PT are separate from one another. An additional embodiment includes a detector in which the joined collector comprises a portion positioned between the B-C junction of the first PT and the B-C junction of the second PT. In this embodiment, an electrically active doping level of the portion of the joined collector may be higher than an electrically active doping level of the base. Another embodiment includes a detector where an interface between the dielectric and a combination of the E-B junction, the base, and the B-C junction is planar, and where an interface between the dielectric and a combination of the E-B junction, the base, and the B-C junction of the first PT, an interface between the dielectric and a combination of the E-B junction, the base, and the B-C junction of the second PT, and a surface of the portion of the joined collector are coplanar.

An additional embodiment includes a detector in which the dielectric comprises continuous portions, and/or the dielectric comprises discrete portions. Additional embodiments include those in which more than half of an atomic composition of the PTs is silicon, or Group III and Group V elements. Another embodiment includes a detector in which the dielectric includes an oxide or a nitride, or where the dielectric is comprised of an amorphous material with a dielectric constant higher than a dielectric constant of silicon dioxide and is selected from the group consisting of $Al_2O_3$, $TiO_2$, $Ta_2O_5$, $HfO_2$, $HfSiO_4$, hafnium silicon oxynitride, $ZrO_2$, $ZrSiO_4$, $La_2O_3$ and combinations thereof. Another embodiment includes a detector in which the dielectric has at least two layers. Another embodiment includes a detector in which at least two floating-base phototransistors electrically connected in a common-collector circuit configuration. A further embodiment includes an image sensor that includes the above-described detector.

Another embodiment entails a method that includes providing a substrate with a first semiconductor layer of a first doping type thereon, and forming a second semiconductor layer of a second doping type on the first semiconductor layer, the second doping type being opposite to the first doping type. The method may further include doping a continuous portion of the second semiconductor layer to the first doping type, wherein the continuous portion surrounds a plurality of discrete portions of the second semiconductor layer, wherein an electrically active doping level of the continuous portion is higher than an electrically active doping level of the discrete portions, wherein the continuous portion is in direct physical contact with the first semiconductor layer. The method also may include forming first p-n junctions between the plurality of discrete portions of the second semiconductor layer and a combination of the continuous portion and the first semiconductor layer, and doping a region within each of the discrete portions to the first doping type, wherein the region does not have direct physical contact with the first p-n junctions. The method also may include forming second p-n junctions between the regions and a remainder of the discrete portions, forming a dielectric on the second semiconductor layer, wherein the first p-n junctions are not exposed through the dielectric, the remainder of the discrete portions is not exposed through the dielectric, and the second p-n junctions are not exposed through the dielectric; and forming electric contacts to the regions and to a combination of the continuous portion and the first layer. In this embodiment, the first p-n junctions may be in direct contact with and encapsulated by a combination of the first layer, the continuous portion, the discrete portions and the dielectric, and the second p-n junctions may be in direct contact with and encapsulated by a combination of the remainder of the discrete portions, the regions and the dielectric.

An additional embodiment includes a method wherein an interface between the dielectric and a nested combination of the first p-n junction, the remainder of the discrete portion, and the second p-n junction is planar. The embodiments also include a method in which an interface between the dielectric and a combination of the continuous portion, the discrete portions and the regions is planar, as well as an embodiment in which the continuous portion is a mesh. In other embodiments, the method may include one in which at least one of the first semiconductor layer and the second semiconductor layer comprises a III-V semiconductor. Additional embodiments encompass a method whereby a net doping density of the second semiconductor layer before doping the continuous portion and before doping the regions is less than $10^{18}$ per cubic centimeter, or a method wherein a net doping density of the continuous portion is greater than $10^{17}$ per cubic centimeter, or a method wherein a net doping density of the region is greater than $10^{17}$ per cubic centimeter.

Another embodiment entails a method that includes providing a substrate with a first semiconductor layer of a first doping type thereon, and doping a plurality of discrete portions of the semiconductor layer to a second doping type, the second doping type being opposite to the first doping type. The method may include forming first p-n junctions between the plurality of discrete portions and a remainder of the semiconductor layer, and doping a region within each of the discrete portions to the first doping type, wherein the region does not have direct physical contact with first p-n junctions. The method also may include forming second p-n junctions between the regions and the discrete portions, forming a dielectric, wherein the first p-n junctions are not exposed through the dielectric, a remainder of the discrete portions are not exposed through the dielectric, and the second p-n junctions are not exposed through the dielectric, and forming electric contacts to the regions and to the remainder of the semiconductor layer. In accordance with the method, the first p-n junctions may be in direct contact with and encapsulated by a combination of the remainder of the semiconductor layer, the discrete portions and the dielectric, and the second p-n junctions may be in direct contact with and encapsulated by a combination of the remainder of the discrete portions, the regions and the dielectric.

Other embodiments include a method wherein an interface between the dielectric and a nested combination of the first p-n junctions, the remainder of the discrete portions and the second p-n junctions is planar, or a method wherein an interface between the dielectric and a combination of the remainder of the semiconductor layer, discrete portions and the regions is planar. Additional embodiments include a method wherein the substrate is silicon-on-insulator (SOI), or wherein the dielectric is silicon dioxide and the method further includes forming a silicon nitride layer on the dielectric

DETAILED DESCRIPTION

Although the term PT is used in this disclosure, the apparatuses and methods disclosed herein are applicable to both homo-junction phototransistors and hetero-junction phototransistors (HPT), as would be appreciated by those having ordinary skill in the art. Therefore, the term "PT," as it is used herein, will be understood to encompass both homo-junction (e.g., silicon) phototransistors and heterojunction (e.g., SiGe and SiGeC) phototransistors.

The terms "planar" and "coplanar" do not necessarily require the respective embodiments to be "atomically planar" or "atomically coplanar." A PT may have three regions: the emitter (E), the base (B) and the collector (C). The emitter junction (ej), also called the emitter-base junction, or the E-B junction, is the p-n junction between the emitter and the base; and the collector junction (cj), also called the base-collector junction, or the B-C junction, is the p-n junction between the collector and the base. Here, a p-n junction refers to the p-n junction or its p-i-n junction variant between an n-type doped semiconductor and a p-type doped semiconductor. Therefore, the term "p-n junction" should be construed to include both the p-n junction and its p-i-n junction variant.

A "two-terminal" PT denotes a PT whose base floats electrically and is not in direct electrical contact with an electrode (e.g., polysilicon or metal). A "two-terminal" PT does not mean that the PT does not have a base. Rather it means a PT with an electrically floating base. In contrast, if the base of a PT is in direct electrical contact with an electrode, the base is not floating, and such a PT is referred to herein as a "three-terminal" PT.

The words "separate" and "joined" refer to geometrically connected and disconnected by the same semiconductor doping type but not necessarily the same doping level, but does not refer to electrical connection. Here, p-type (positive hole type) and i-type (intrinsic type) can be considered as the same doping type, n-type (negative electron type) and i-type (intrinsic type) can be considered as the same doping type, but p-type (positive hole type) and n-type (negative electron type) are NOT the same doping type. P-type (positive hole type) and n-type (negative electron type) are opposite doping types.

Figure 1:
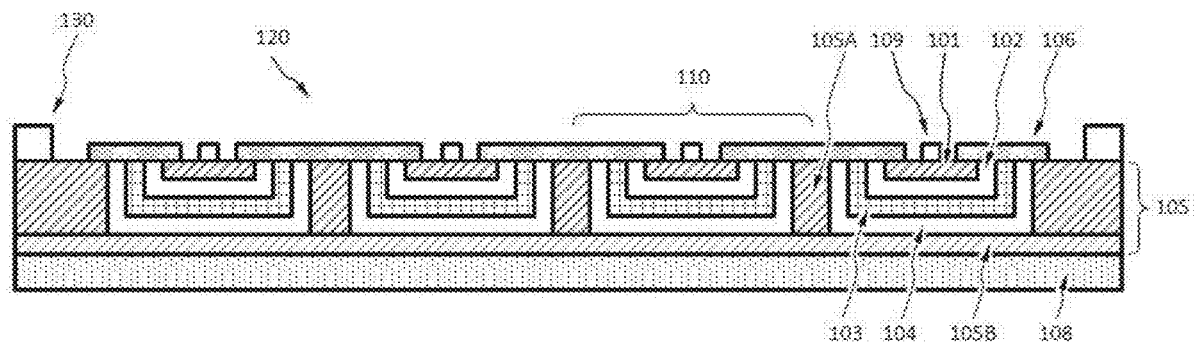
FIG. 1 illustrates a cross-sectional view of a phototransistor (PT) array with conductive isolation between PTs and with continuous portions of dielectric.

FIG. 1 illustrates a planar phototransistor (PT) array 120 with conductive inter-PT isolation 105 between neighboring phototransistors (PT) 110. FIG. 1, along with the remaining figures discussed herein, are not drawn to scale, as will be appreciated by those having ordinary skill in the art. The PT array 120 comprises a dielectric 106, a plurality of phototransistors (PTs) 110, each PT 110 further comprising an emitter 101, a floating base 103 and a collector 105, which collector 105 is further comprised of collector portion 105A and collector layer 105B.

A p-n junction between the emitter and the base (E-B junction) 102 is in direct contact only with and completely encapsulated only by the emitter 101, the base 103 and the dielectric 106. The base 103 is shown to be in direct contact only with and completely encapsulated only by the E-B junction 102, a p-n junction between the base and the collector (B-C junction) 104 and the dielectric 106. Finally, the B-C junction 104 is shown to be in direct contact only with and completely encapsulated only by a combination of the base 103, the collector 105 and the dielectric 106; and a combination of the E-B junction 102, the base 103 and the B-C junction 104 is in direct contact only with and completely encapsulated only by a combination of the emitter 101, the collector 105 and the dielectric 106.

The emitter 101 of the first PT 110 and the emitter of the second PT are separate; the E-B junction 102 of the first PT 110 and the E-B junction of the second PT are separate; the base 103 of the first PT 110 and the base of the second PT are separate; and the B-C junction 104 of the first PT 110 and the B-C junction of the second PT are separate. The collector 105 of the first PT 110 and the collector of the second PT are joined as a joined collector 105, which joint collector 105 acts as the conductive inter-PT isolation between PT 110 and other PTs in the PT array 120 including but not limited to its neighboring PTs. A PT emitter electrical contact 109 electrically connects to the PT emitter 101 of each PT, and a common electrical contact 130 connects to each PT collector 105 of the entire PT array 120 on substrate 108. The joined collector 105 comprises a portion 105A positioned between the B-C junction 104 of the first PT 110 and the B-C junction of the second PT, wherein an electrically active doping level of the collector portion 105A may be higher than an electrically active doping level of the base 103.

An interface between the dielectric 106 and a combination of the E-B junction 102, the base 103 and the B-C junction 104 can be planar. An interface between the dielectric 106 and a combination of the E-B junction 102, the base 103 and the B-C junction 104 of the first PT 110, an interface between the dielectric and a combination of the E-B junction, the base and the B-C junction of the second PT, and a surface of the collector portion 105A can be coplanar. The dielectric 106 may comprise either continuous portions (as shown in FIG. 1) or discrete portions (not shown in FIG. 1) or a combination thereof (not shown in FIG. 1).

The PT array 120 can be fabricated from Group-IV materials, including but not limited to, silicon (Si) and its alloys, or from Group-III-V materials, including but not limited to, InP, InGaAs, GaAs, GaN, GaSb, InAs, InSb, and alloys thereof. The dielectric 106 may comprise an oxide or a nitride, may comprise at least two distinct layers, and may comprise an amorphous material with a dielectric constant higher than a dielectric constant of silicon dioxide. Suitable materials that can be used to fabricate dielectric 106 include, for example, $Al_2O_3$, $TiO_2$, $Ta_2O_5$, $HfO_2$, $HfSiO_4$, hafnium silicon oxynitride, $ZrO_2$, $ZrSiO_4$, $La_2O_3$ or a combination thereof.

At least two floating-base phototransistors 110 are electrically connected in a common-collector circuit configuration. The PT array 120 may be used as a part of a focal plane array (FPA) image sensor.

Figure 2:
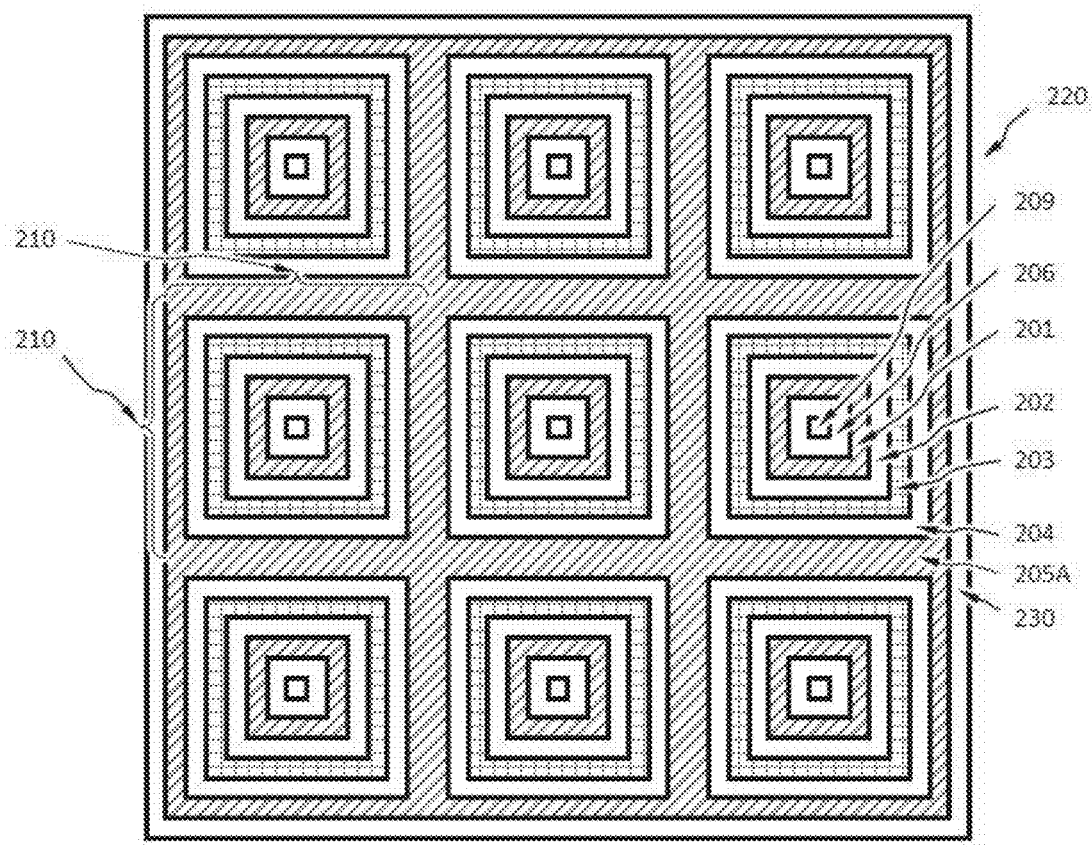
FIG. 2 illustrates a top view of a phototransistor (PT) array with conductive isolation between PTs.

FIG. 2 illustrates a planar phototransistor (PT) array 220 with conductive inter-PT isolation 205A between neighboring phototransistors (PT) 210. The PT array 220 comprises a dielectric outside opening 206, a plurality of phototransistors (PTs) 210, each PT 210 further comprising an emitter 201, a floating base 203 and a collector, which collector is further comprised of collector portion 205A and collector layer.

A p-n junction between the emitter and the base (E-B junction) 202 is in direct contact only with and completely encapsulated only by the emitter 201, the base 203, and the dielectric outside opening 206. The base 203 is in direct contact only with and completely encapsulated only by the E-B junction 202, a p-n junction between the base and the collector (B-C junction) 204, and the dielectric outside opening 206. The B-C junction 204 is in direct contact only with and completely encapsulated only by a combination of the base 203, the collector, and the dielectric outside opening 206. Finally, a combination of the E-B junction 202, the base 203, and the B-C junction 204 is in direct contact only with and completely encapsulated only by a combination of the emitter 201, the collector, and the dielectric outside opening 206.

The emitter 201 of the first PT 210 and the emitter of the second PT are separate from one another. The E-B junction 202 of the first PT 210 and the E-B junction of the second PT are separate from one another. Similarly, the base 203 of the first PT 210 and the base of the second PT are separate, and the B-C junction 204 of the first PT 210 and the B-C junction of the second PT are separate. The collector of the first PT 210 and the collector of the second PT are joined as a joined collector, which joint collector acts as the conductive inter-PT isolation between PT 210 and other PTs in the PT array 220 including but not limited to its neighboring PTs. A PT emitter electrical contact 209 electrically connects to the PT emitter 201 of each PT, and common electrical contact 230 connects to each PT collector of the entire PT array 220 on substrate. The joined collector comprises a portion 205A positioned between the B-C junction 204 of the first PT 210 and the B-C junction of the second PT, wherein an electrically active doping level of the collector portion 205A may be higher than an electrically active doping level of the base 203.

An interface between the dielectric outside opening 206 and a combination of the E-B junction 202, the base 203 and the B-C junction 204 preferably is planar. An interface between the dielectric outside opening 206 and a combination of the E-B junction 202, the base 203 and the B-C junction 204 of the first PT 210, an interface between the dielectric and a combination of the E-B junction, the base and the B-C junction of the second PT, and a surface of the collector portion 205A preferably are coplanar.

The dielectric outside opening 206 may comprise either continuous portions (as shown in FIG. 2) or discrete portions (not shown in FIG. 2) or a combination thereof (not shown in FIG. 2).

The PT array 220 can be fabricated from Group-IV materials, including but not limited to, silicon (Si) and its alloys, or from Group-III-V materials, including but not limited to, InP, InGaAs, GaAs, GaN, GaSb, InAs, InSb, and alloys thereof. The dielectric 206 may comprise an oxide or a nitride, may comprise at least two distinct layers, and may comprise an amorphous material with a dielectric constant higher than a dielectric constant of silicon dioxide. Suitable materials that can be used to fabricate dielectric outside opening 206 include, for example, $Al_2O_3$, $TiO_2$, $Ta_2O_5$, $HfO_2$, $HfSiO_4$, hafnium silicon oxynitride, $ZrO_2$, $ZrSiO_4$, $La_2O_3$ or combinations thereof.

At least two floating-base phototransistors 210 are electrically connected in a common-collector circuit configuration. The PT array 220 may be used as a part of a focal plane array (FPA) image sensor.

Figure 3:
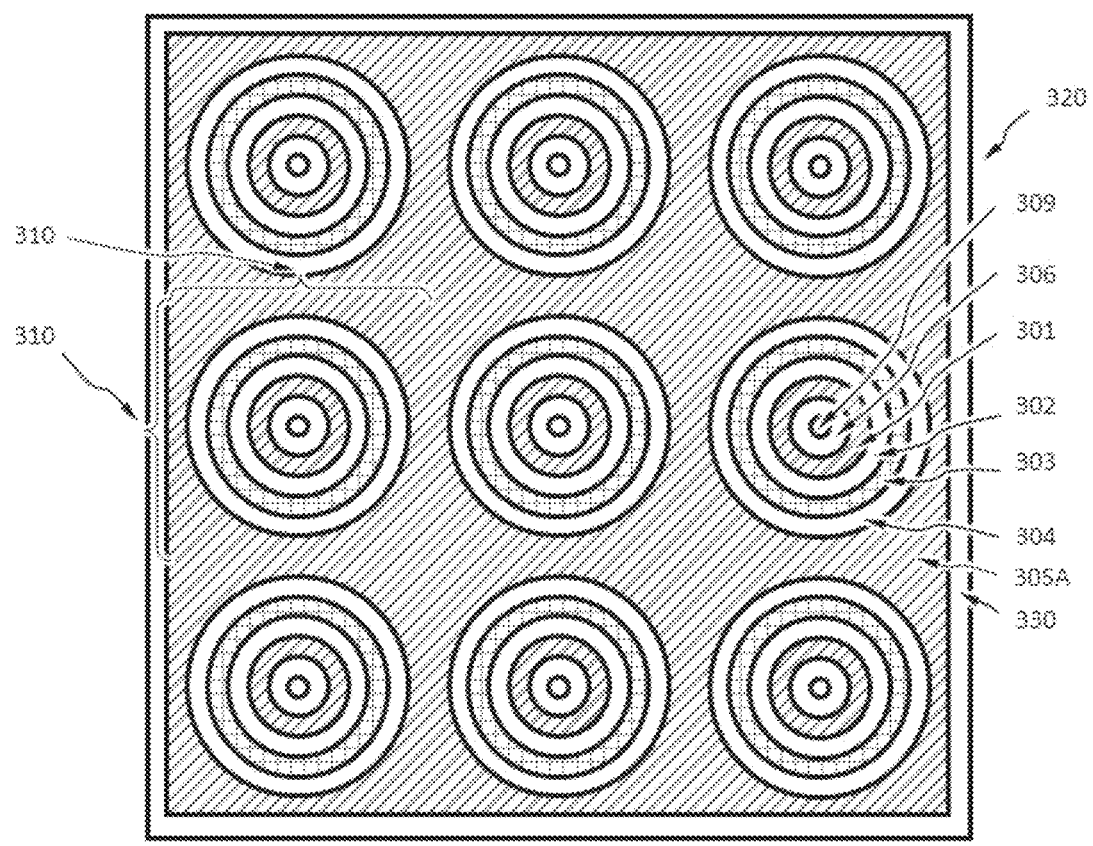
FIG. 3 depicts a top view of a phototransistor (PT) array with conductive isolation between PTs.

FIG. 3 illustrates a planar phototransistor (PT) array 320 with conductive inter-PT isolation 305A between neighboring phototransistors (PT) 310. The PT array 320 comprises a dielectric outside opening 306, a plurality of phototransistors (PTs) 310, each PT 310 further comprising an emitter 301, a floating base 303 and a collector, which collector is further comprised of collector portion 305A and collector layer.

A p-n junction between the emitter and the base (E-B junction) 302 is in direct contact only with and completely encapsulated only by the emitter 301, the base 303, and the dielectric outside opening 306. The base 303 is in direct contact only with and completely encapsulated only by the E-B junction 302, a p-n junction between the base and the collector (B-C junction) 304, and the dielectric outside opening 306. The B-C junction 304 is in direct contact only with and completely encapsulated only by a combination of the base 303, the collector, and the dielectric outside opening 306. Finally, a combination of the E-B junction 302, the base 303 and the B-C junction 304 is in direct contact only with and completely encapsulated only by a combination of the emitter 301, the collector, and the dielectric outside opening 306.

The emitter 301 of the first PT 310 and the emitter of the second PT are separate from one another. The E-B junction 302 of the first PT 310 and the E-B junction of the second PT are separate from one another. The base 303 of the first PT 310 and the base of the second PT are separate from one another. The B-C junction 304 of the first PT 310 and the B-C junction of the second PT are separate from one another. The collector of the first PT 310 and the collector of the second PT are joined as a joined collector, which joint collector acts as the conductive inter-PT isolation between PT 310 and other PTs in the PT array 320 including but not limited to its neighboring PTs. A PT emitter electrical contact 309 electrically connects to the PT emitter 301 of each PT, and common electrical contact 330 connects to each PT collector of the entire PT array 320 on substrate. The joined collector comprises a portion 305A positioned between the B-C junction 304 of the first PT 310 and the B-C junction of the second PT, wherein an electrically active doping level of the collector portion 305A may be higher than an electrically active doping level of the base 303.

An interface between the dielectric outside opening 306 and a combination of the E-B junction 302, the base 303 and the B-C junction 304 preferably is planar. An interface between the dielectric outside opening 306 and a combination of the E-B junction 302, the base 303 and the B-C junction 304 of the first PT 310, an interface between the dielectric and a combination of the E-B junction, the base and the B-C junction of the second PT, and a surface of the collector portion 305A preferably are coplanar.

The dielectric outside opening 306 may comprise either continuous portions (as shown in FIG. 3) or discrete portions (not shown in FIG. 3) or a combination thereof (not shown in FIG. 3).

The PT array 320 can be fabricated from Group-IV materials including but not limited to silicon (Si) and its alloys, or from Group-III-V materials including but not limited to InP, InGaAs, GaAs, GaN, GaSb, InAs, InSb and alloys thereof. The dielectric outside opening 306 may comprise an oxide or a nitride, may comprise at least two distinct layers, and may comprise an amorphous material with a dielectric constant higher than a dielectric constant of silicon dioxide. Suitable materials that can be used to fabricate dielectric outside opening 306 may include, for example, $Al_2O_3$, $TiO_2$, $Ta_2O_5$, $HfO_2$, $HfSiO_4$, hafnium silicon oxynitride, $ZrO_2$, $ZrSiO_4$, $La_2O_3$ or combinations thereof.

At least two floating-base phototransistors 310 are electrically connected in a common-collector circuit configuration. The PT array 320 may be used as a part of a focal plane array (FPA) image sensor.

Figure 4:
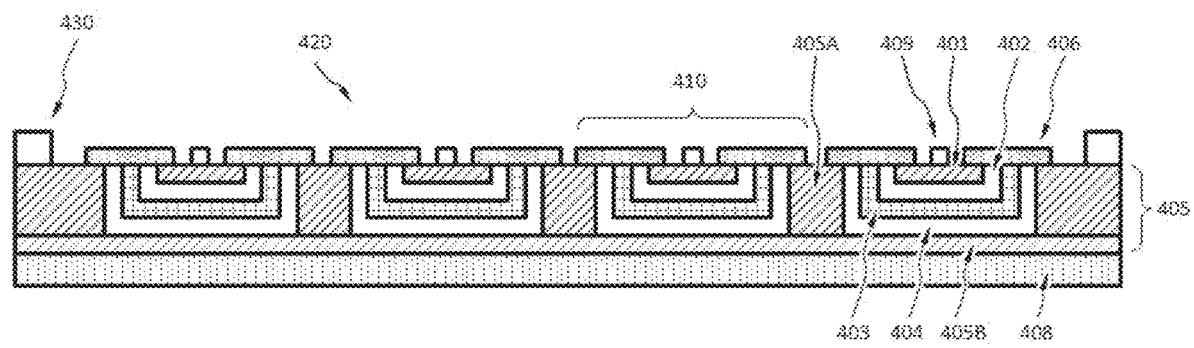
FIG. 4 shows a cross-sectional view of a phototransistor (PT) array with conductive isolation between PTs and with discrete portions of dielectric.

Shown in FIG. 4 is a planar phototransistor (PT) array 420 with conductive inter-PT isolation 405 between neighboring phototransistors (PT) 410. The PT array 420 comprises a dielectric 406, a plurality of phototransistors (PTs) 410, each PT 410 further comprising an emitter 401, a floating base 403 and a collector 405, which collector 405 is further comprised of collector portion 405A and collector layer 405B.

A p-n junction between the emitter and the base (E-B junction) 402 is in direct contact only with and completely encapsulated only by the emitter 401, the base 403, and the dielectric 406. The base 403 is in direct contact only with and completely encapsulated only by the E-B junction 402, a p-n junction between the base and the collector (B-C junction) 404, and the dielectric 406. The B-C junction 404 is in direct contact only with and completely encapsulated only by a combination of the base 403, the collector 405, and the dielectric 406. Finally, a combination of the E-B junction 402, the base 403, and the B-C junction 404 is in direct contact only with and completely encapsulated only by a combination of the emitter 401, the collector 405, and the dielectric 406.

The emitter 401 of the first PT 410 and the emitter of the second PT are separate from one another, the E-B junction 402 of the first PT 410 and the E-B junction of the second PT are separate from one another, the base 403 of the first PT 410 and the base of the second PT are separate from one another, and the B-C junction 404 of the first PT 410 and the B-C junction of the second PT are separate from one another. The collector 405 of the first PT 410 and the collector of the second PT are joined as a joined collector 405, which joint collector 405 acts as the conductive inter-PT isolation between PT 410 and other PTs in the PT array 420 including but not limited to its neighboring PTs. A PT emitter electrical contact 409 electrically connects to the PT emitter 401 of each PT, and common electrical contact 430 connects to every PT collector 405 of the entire PT array 420 on substrate 408. The joined collector 405 comprises a portion 405A positioned between the B-C junction 404 of the first PT 410 and the B-C junction of the second PT, wherein an electrically active doping level of the collector portion 405A may be higher than an electrically active doping level of the base 403.

An interface between the dielectric 406 and a combination of the E-B junction 402, the base 403 and the B-C junction 404 may be planar. An interface between the dielectric 406 and a combination of the E-B junction 402, the base 403, and the B-C junction 404 of the first PT 410, an interface between the dielectric and a combination of the E-B junction, the base and the B-C junction of the second PT, and a surface of the collector portion 405A preferably are coplanar.

The dielectric 406 may comprise either continuous portions (not shown in FIG. 4) or discrete portions (as shown in FIG. 4) or a combination thereof (not shown in FIG. 4).

The PT array 420 may be fabricated with Group-IV materials including, but not limited to silicon (Si) and its alloys, or with Group-III-V materials including, but not limited to InP, InGaAs, GaAs, GaN, GaSb, InAs, InSb and alloys thereof. The dielectric 406 may comprise an oxide or a nitride, may comprise at least two distinct layers, and may comprise an amorphous material with a dielectric constant higher than a dielectric constant of silicon dioxide. Suitable materials that can be used to fabricate dielectric 406 may include, for example, $Al_2O_3$, $TiO_2$, $Ta_2O_5$, $HfO_2$, $HfSiO_4$, hafnium silicon oxynitride, $ZrO_2$, $ZrSiO_4$, $La_2O_3$ or combinations thereof.

At least two floating-base phototransistors 410 are electrically connected in a common-collector circuit configuration. The PT array 420 may be used as a part of a focal plane array (FPA) image sensor.

Figure 5:
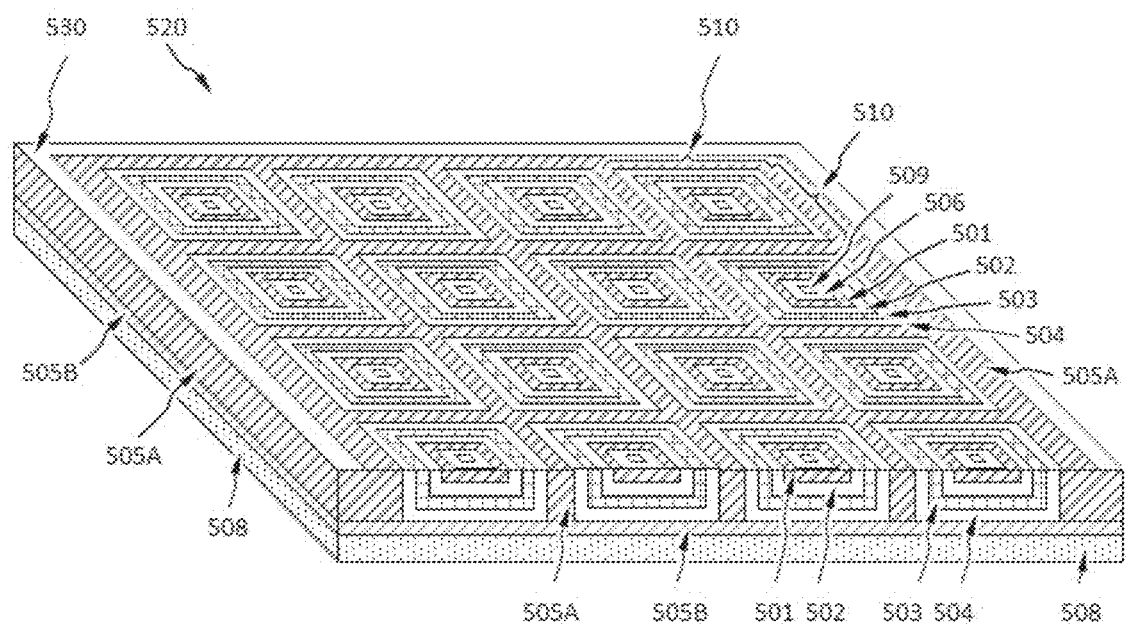
FIG. 5 illustrates a 3-dimensional view of a phototransistor (PT) array with conductive isolation between PTs, wherein the thicknesses of dielectric 506 and electrical contacts 509 & 530 are NOT shown.

FIG. 5 shows a planar phototransistor (PT) array 520 with conductive inter-PT isolation 505 between neighboring phototransistors (PT) 510. The thicknesses of dielectric outside opening 506 and electrical contacts 509 and 530 are not shown. The PT array 520 comprises a dielectric outside opening 506, a plurality of phototransistors (PTs) 510, each PT 510 further comprising an emitter 501, a floating base 503 and a collector 505, which collector 505 is further comprised of collector portion 505A and collector layer 505B.

A p-n junction between the emitter and the base (E-B junction) 502 is in direct contact only with and completely encapsulated only by the emitter 501, the base 503, and the dielectric outside opening 506. The base 503 is in direct contact only with and completely encapsulated only by the E-B junction 502, a p-n junction between the base and the collector (B-C junction) 504, and the dielectric outside opening 506. The B-C junction 504 is in direct contact only with and completely encapsulated only by a combination of the base 503, the collector 505, and the dielectric outside opening 506. Finally, a combination of the E-B junction 502, the base 503, and the B-C junction 504 is in direct contact only with and completely encapsulated only by a combination of the emitter 501, the collector 505, and the dielectric outside opening 506.

The emitter 501 of the first PT 510 and the emitter of the second PT are separate from one another, and the E-B junction 502 of the first PT 510 and the E-B junction of the second PT are separate from one another. In addition, the base 503 of the first PT 510 and the base of the second PT are separate from one another, and the B-C junction 504 of the first PT 510 and the B-C junction of the second PT are separate from one another. The collector 505 of the first PT 510 and the collector of the second PT are joined as a joined collector 505, which joint collector 505 acts as the conductive inter-PT isolation between PT 510 and other PTs in the PT array 520 including but not limited to its neighboring PTs. A PT emitter electrical contact 509 electrically connects to the PT emitter 501 of each PT, and common electrical contact 530 connects to each PT collector 505 of the entire PT array 520 on substrate 508. The joined collector 505 comprises a portion 505A positioned between the B-C junction 504 of the first PT 510 and the B-C junction of the second PT, wherein an electrically active doping level of the collector portion 505A may be higher than an electrically active doping level of the base 503.

An interface between the dielectric outside opening 506 and a combination of the E-B junction 502, the base 503 and the B-C junction 504 preferably is planar. An interface between the dielectric outside opening 506 and a combination of the E-B junction 502, the base 503 and the B-C junction 504 of the first PT 510, an interface between the dielectric and a combination of the E-B junction, the base and the B-C junction of the second PT, and a surface of the collector portion 505A preferably are coplanar.

The dielectric outside opening 506 may comprise either continuous portions (as shown in FIG. 5) or discrete portions (not shown in FIG. 5) or a combination thereof (not shown in FIG. 5).

The PT array 520 can be fabricated from Group-IV materials including, but not limited to silicon (Si) and its alloys, or from Group-III-V materials including, but not limited to InP, InGaAs, GaAs, GaN, GaSb, InAs, InSb and alloys thereof. The dielectric outside opening 506 may comprise an oxide or a nitride, may comprise at least two distinct layers, and may comprise an amorphous material with a dielectric constant higher than a dielectric constant of silicon dioxide. Materials suitable for forming dielectic outside opening 506 include, but are not limited to $Al_2O_3$, $TiO_2$, $Ta_2O_5$, $HfO_2$, $HfSiO_4$, hafnium silicon oxynitride, $ZrO_2$, $ZrSiO_4$, $La_2O_3$ or combinations thereof.

At least two floating-base phototransistors 510 are electrically connected in a common-collector circuit configuration. The PT array 520 may be used as a part of a focal plane array (FPA) image sensor.

Figure 6:
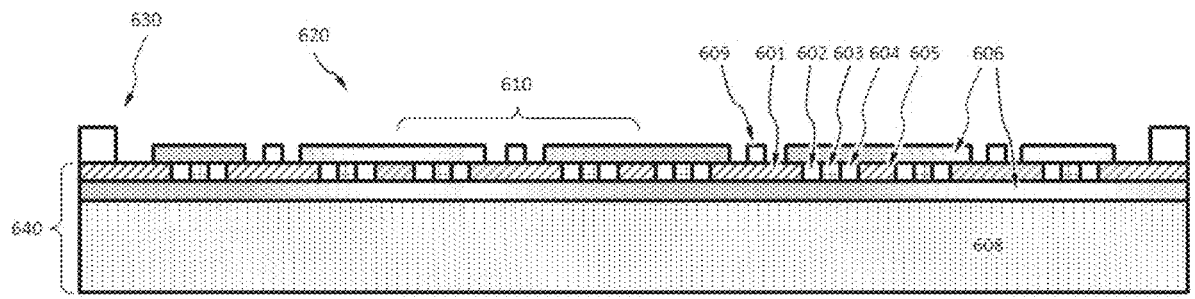
FIG. 6 is a cross-sectional view of a phototransistor (PT) array with conductive isolation between PTs on silicon-on-insulator (SOI).

FIG. 6 illustrates a planar phototransistor (PT) array 620 with conductive inter-PT isolation 605 between neighboring phototransistors (PT) 610 on silicon-on-insulator (SOI) substrate 640 including its mechanical handle wafer 608. The PT array 620 comprises a dielectric 606, a plurality of phototransistors (PTs) 610, each PT 610 further comprising an emitter 601, a floating base 603 and a collector 605.

A p-n junction between the emitter and the base (E-B junction) 602 is in direct contact only with and completely encapsulated only by the emitter 601, the base 603, and the dielectric 606. The base 603 is in direct contact only with and completely encapsulated only by the E-B junction 602, a p-n junction between the base and the collector (B-C junction) 604, and the dielectric 606. The B-C junction 604 is in direct contact only with and completely encapsulated only by a combination of the base 603, the collector 605, and the dielectric 606. Finally, a combination of the E-B junction 602, the base 603, and the B-C junction 604 is in direct contact only with and completely encapsulated only by a combination of the emitter 601, the collector 605, and the dielectric 606.

The emitter 601 of the first PT 610 and the emitter of the second PT are separate from one another, and the E-B junction 602 of the first PT 610 and the E-B junction of the second PT are separate from one another. The base 603 of the first PT 610 and the base of the second PT are separate from one another, and the B-C junction 604 of the first PT 610 and the B-C junction of the second PT are separate from one another. The collector 605 of the first PT 610 and the collector of the second PT are joined as a joined collector 605, which joint collector 605 acts as the conductive inter-PT isolation between PT 610 and other PTs in the PT array 620 including but not limited to its neighboring PTs. A PT emitter electrical contact 609 electrically connects to the PT emitter 601 of each PT, and common electrical contact 630 connects to each PT collector 605 of the entire PT array 620 on SOI substrate 640. The joined collector 605 is positioned between the B-C junction 604 of the first PT 610 and the B-C junction of the second PT, wherein an electrically active doping level of the collector 605 may be higher than or lower than an electrically active doping level of the base 603.

An interface between the dielectric 606 and a combination of the E-B junction 602, the base 603, and the B-C junction 604 preferably is planar. An interface between the dielectric 606 and a combination of the E-B junction 602, the base 603, and the B-C junction 604 of the first PT 610, an interface between the dielectric and a combination of the E-B junction, the base, and the B-C junction of the second PT, and a surface of the collector 605 preferably are coplanar.

The dielectric 606 may comprise continuous portions, as shown in FIG. 6. The PT array 620 can be fabricated with Group-IV materials including, but not limited to silicon (Si) and alloys thereof. The dielectric 606 may comprise an oxide or a nitride, may comprise at least two distinct layers, and may comprise an amorphous material with a dielectric constant higher than a dielectric constant of silicon dioxide. Suitable materials for forming dielectric 606 include, but are not limited to $Al_2O_3$, $TiO_2$, $Ta_2O_5$, $HfO_2$, $HfSiO_4$, hafnium silicon oxynitride, $ZrO_2$, $ZrSiO_4$, $La_2O_3$ or combinations thereof.

At least two floating-base phototransistors 610 are electrically connected in a common-collector circuit configuration. The PT array 620 may be used as a part of a focal plane array (FPA) image sensor.

Figure 7A:
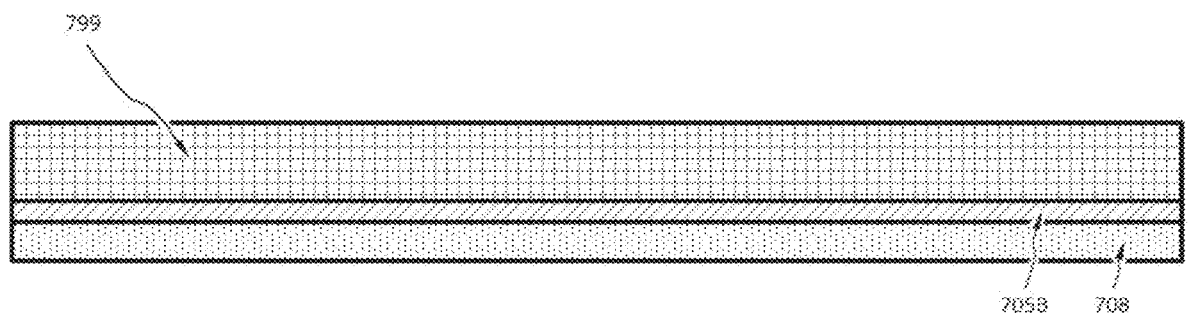
FIGS. 7A-7G show a process flow for fabricating a phototransistor (PT) array with conductive isolation between PTs in III-V semiconductor.

Shown in FIGS. 7A through 7G is a process flow (comprising at least the following processes, but not necessarily in the following order) for fabricating a phototransistor (PT) array 720 with conductive isolation 705 between PTs 710 in III-V semiconductors, in accordance with an embodiment. A substrate 708 is obtained, and provided with a first semiconductor layer 705B of a first doping type thereon. A second semiconductor layer 799 of a second doping type is formed on the first semiconductor layer 705B, the second doping type being opposite to the first doping type, as shown in FIG. 7A.

Figure 7B:
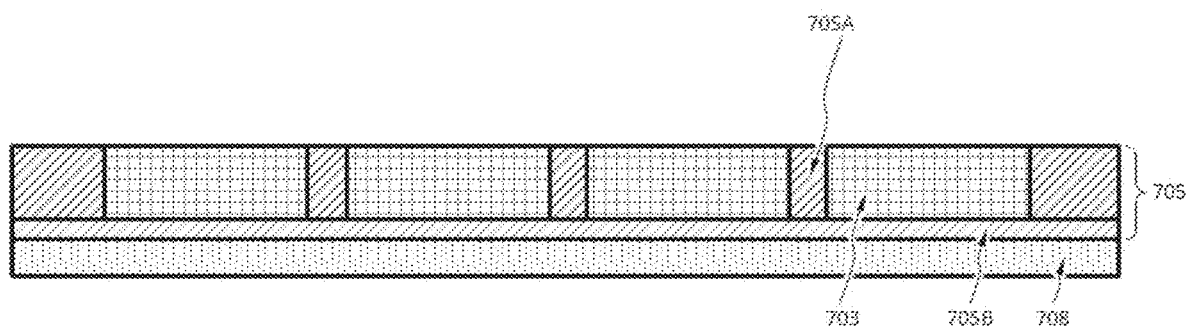

A continuous portion 705A of the second semiconductor layer 799 is doped to be consistent with the first doping type, wherein the continuous portion 705A surrounds a plurality of discrete portions 703 of the second semiconductor layer 799. In this embodiment, an electrically active doping level of the continuous portion 705A preferably is higher than an electrically active doping level of the discrete portions 703, wherein the continuous portion 705A is in direct physical contact with the first semiconductor layer 705B, and wherein the continuous portion 705A and the first semiconductor layer 705B jointly form a continuous combination 705 of the first doping type, as shown in FIG. 7B.

Figure 7C:
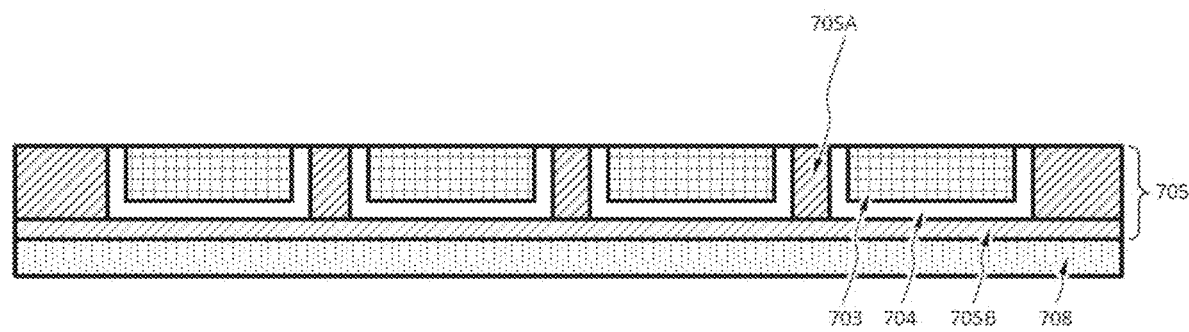
Figure 7D:
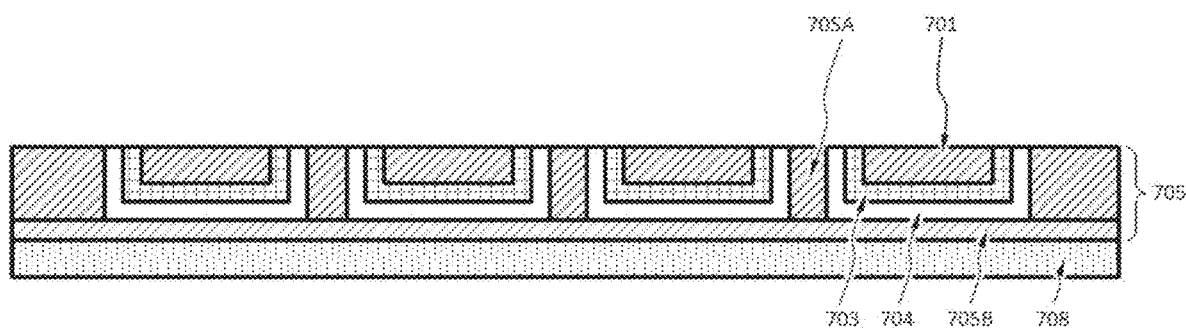

A plurality of first p-n junctions 704 are formed between the plurality of discrete portions 703 of the second semiconductor layer 799 and the continuous combination 705 of the continuous portion 705A and the first semiconductor layer 705B, as shown in FIG. 7C. A region 701 within each of the discrete portions 703 is doped to the first doping type, wherein the region does not have direct physical contact with first p-n junctions 704, as shown in FIG. 7D.

Figure 7E:
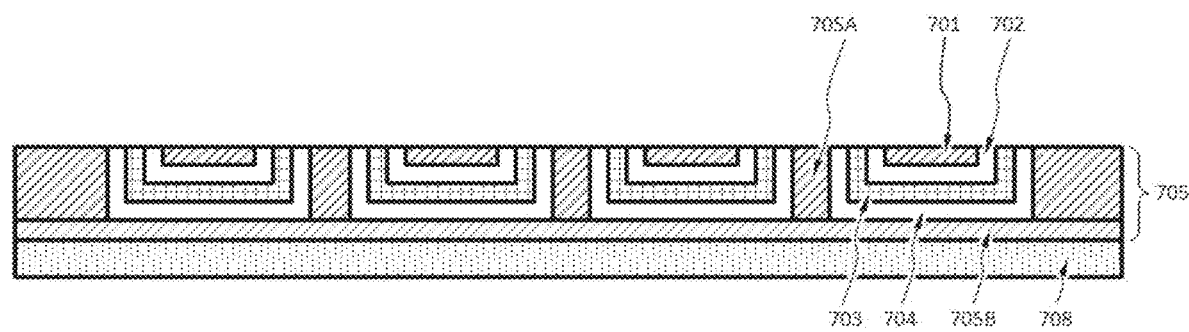
Figure 7F:
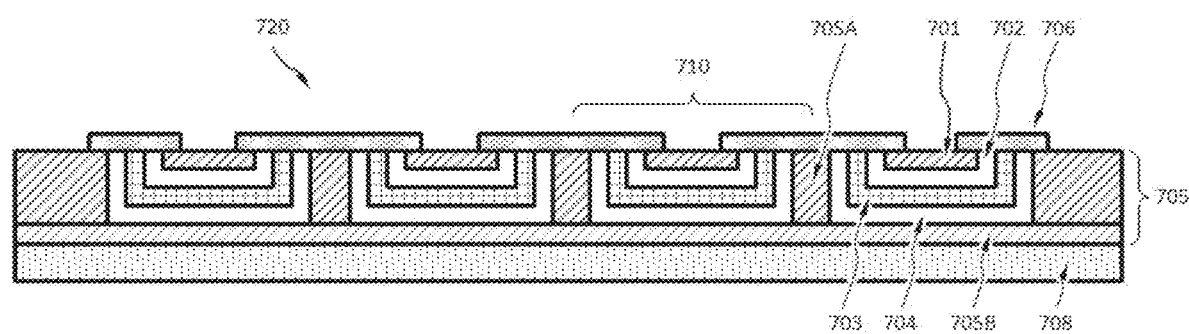

A plurality of second p-n junctions 702 are formed between the regions 701 and a remainder of the discrete portions 703, as shown in FIG. 7E. A dielectric 706 is formed on the remaining structure such that the first p-n junctions 704 are not exposed through the dielectric 706, the remainder of the discrete portions 703 is not exposed through the dielectric 706, and the second p-n junctions 702 are not exposed through the dielectric 706, as shown in FIG. 7F.

Figure 7G:
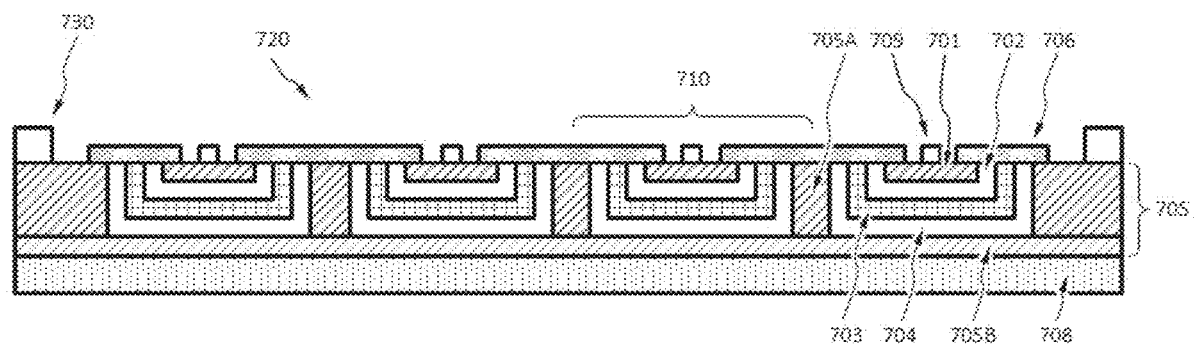

Electric contacts 709 are formed to the regions 701; and electrical contacts 730 are formed to the continuous combination 705 of the continuous portion 705A and the first layer 705B, as shown in FIG. 7G. As shown in FIG. 7G, the first p-n junctions 704 are in direct contact only with and completely encapsulated only by a combination of the discrete portions 703, the dielectric 706, and the continuous combination 705 of the first layer 705B and the continuous portion 705A.

As further shown in FIG. 7G, the second p-n junctions 702 are in direct contact only with and completely encapsulated only by a combination of the remainder of the discrete portions 703, the regions 701, and the dielectric 706. The remainder of the discrete portions 703 are in direct contact only with and completely encapsulated only by a combination of the first p-n junctions 704, the second p-n junctions 702 and the dielectric 706. An interface between the dielectric 706 and a nested combination of the first p-n junction 704, the remainder of the discrete portion 703, and the second p-n junction 702 preferably is planar. An interface between the dielectric 706 and a combination of the continuous portion 705A, the discrete portions 703 and the regions 701 preferably is planar.

As shown in FIGS. 7A-7G, any of the semiconductor layers may comprise a III-V semiconductor. The continuous portion 705A can be a mesh. In addition, the embodiment of FIG. 7G can provide a net doping density of the second semiconductor layer 799 before doping the continuous portion 705A and before doping the regions 701 of less than $10^{18}$ per cubic centimeter. In addition, the net doping density of the continuous portion 705A can be greater than $10^{17}$ per cubic centimeter, and the net doping density of the region 701 can be greater than $10^{17}$ per cubic centimeter.

Shown in FIGS. 8A through 8G is a process flow (comprising at least the following processes, but not necessarily in the following order) for fabricating a phototransistor (PT) array 820 with conductive isolation 805 between PTs 810 in group-IV semiconductor, in accordance with an embodiment. The Group IV semiconductor may be fabricated from a material including, but not limited to silicon (Si), silicon-on-insulator (SOI), and alloys thereof.

Figure 8A:
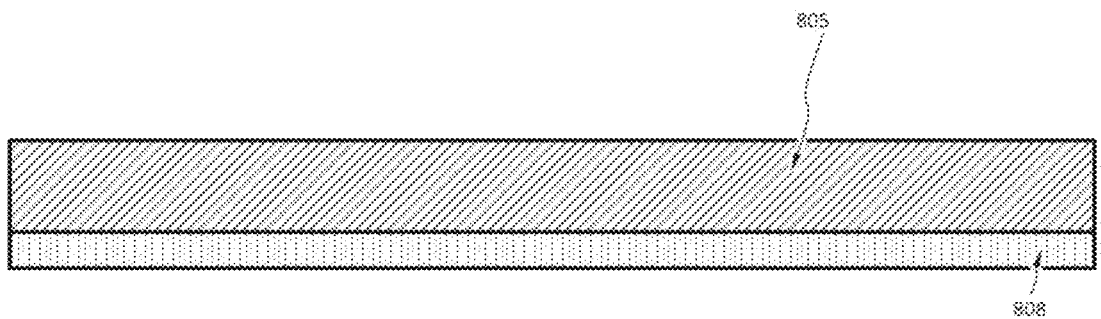
FIGS. 8A-8G illustrate a process flow for fabricating a phototransistor (PT) array with conductive isolation between PTs in IV semiconductor, including but not limited to silicon (Si) and silicon-on-insulator (SOI).
Figure 8B:
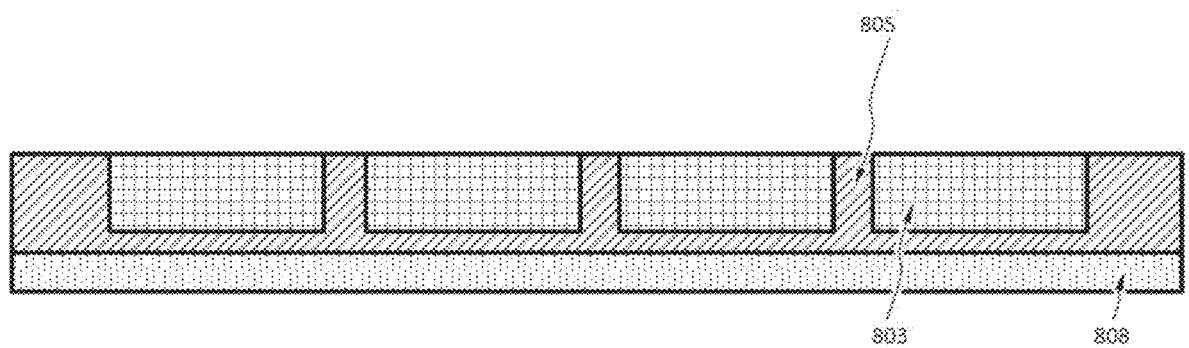
Figure 8C:
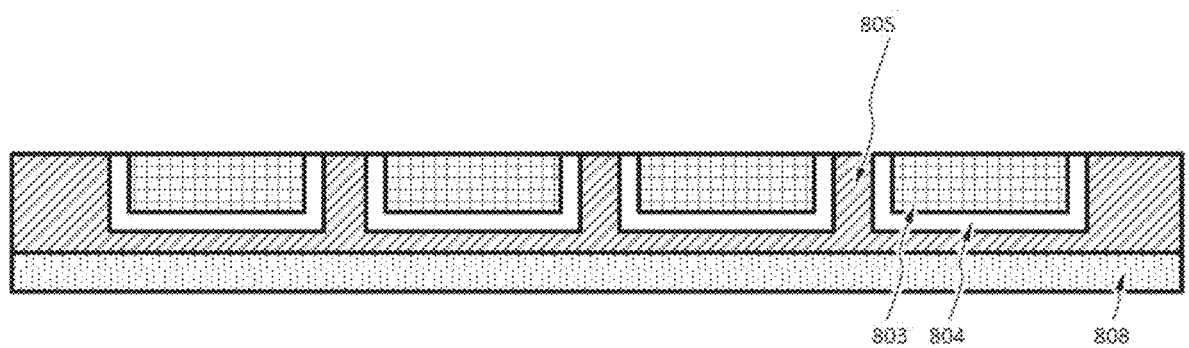
Figure 8D:
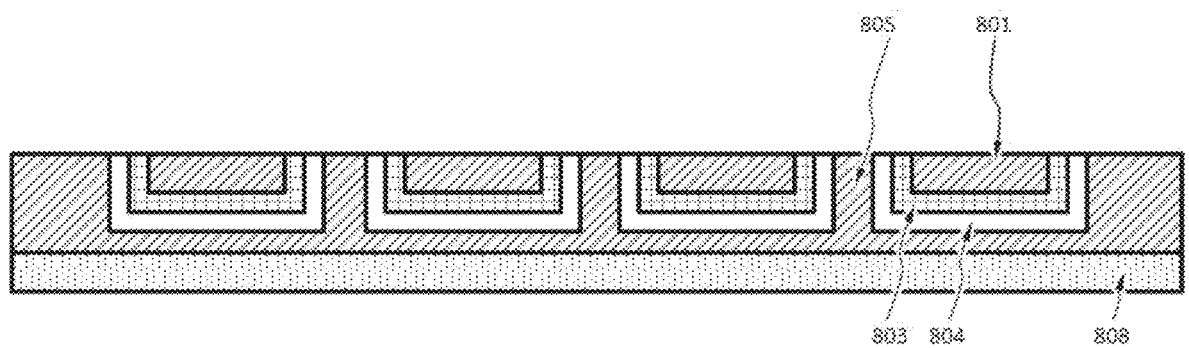

A substrate 808 is obtained and provided thereon with a semiconductor layer 805 of a first doping type, as shown in FIG. 8A. A plurality of discrete portions 803 of the semiconductor layer are doped to a second doping type, the second doping type being opposite to the first doping type, as shown in FIG. 8B. First p-n junctions 804 are formed between the plurality of discrete portions 803 and a remainder of the semiconductor layer 805, as show in FIG. 8C. A region 801 within each of the discrete portions 803 is doped to the first doping type, wherein the region 801 does not have direct physical contact with first p-n junctions 804, as shown in FIG. 8D.

Figure 8E:
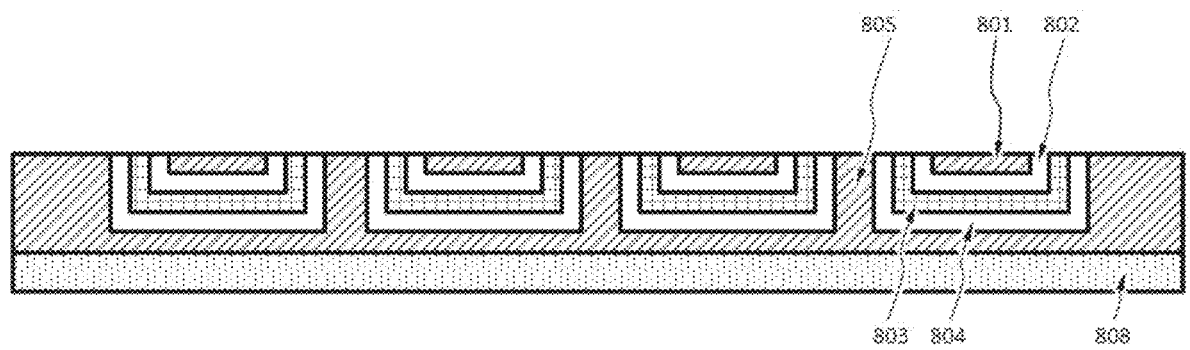
Figure 8F:
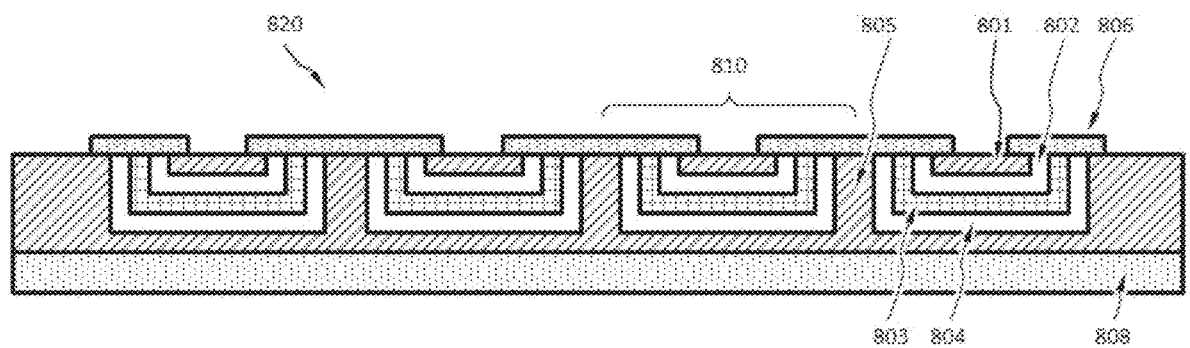

Second p-n junctions 802 are formed between the regions 801 and a remainder of the discrete portions 803, as shown in FIG. 8E. A dielectric 806 is formed, wherein the first p-n junctions 804 are not exposed through the dielectric 806, the remainder of the discrete portions 803 are not exposed through the dielectric 806, and the second p-n junctions 802 are not exposed through the dielectric 806, as shown in FIG. 8F. Electric contacts 809 are formed to the regions 801, and electric contacts 830 are formed to the remainder of the semiconductor layer 805, as shown in FIG. 8G.

Figure 8G:
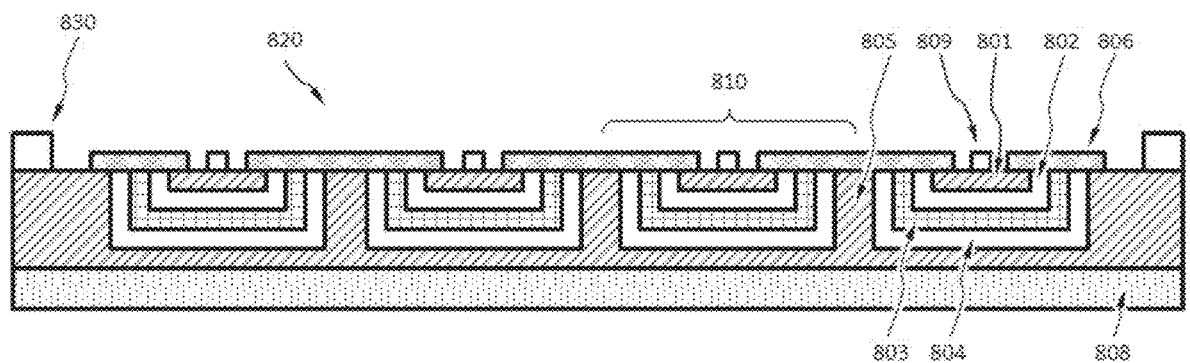

In the embodiment shown in FIG. 8G, the first p-n junctions 804 are in direct contact only with and completely encapsulated only by a combination of the remainder of the semiconductor layer 805, the discrete portions 803, and the dielectric 806. In addition, the second p-n junctions 802 are in direct contact only with and completely encapsulated only by a combination of the remainder of the discrete portions 803, the regions 801, and the dielectric 806. The remainder of the discrete portions 803 are in direct contact only with and completely encapsulated only by a combination of the first p-n junctions 804, the second p-n junctions 802, and the dielectric 806.

In the embodiment of FIG. 8G, there is a planar interface between the dielectric 806 and a nested combination of the first p-n junctions 804, the remainder of the discrete portions 803, and the second p-n junctions 802. There also is a planar interface between the dielectric 806 and a combination of the remainder of the semiconductor layer 805, discrete portions 803, and the regions 801. The substrate 808 may be silicon (Si) or silicon-on-insulator (SOI), the dielectric 806 may be silicon dioxide and the method may further comprise forming a silicon nitride layer on the dielectric 806.

While the invention has been described with reference to particularly preferred embodiments and with reference to the drawings, a person having ordinary skill in the art will appreciate that the disclosed embodiments are not limiting, and that various modifications may be made to the embodiments disclosed herein.

What is claimed is:

1. A detector comprising at least two floating-base phototransistors (PT) electrically connected in a common-collector circuit configuration, wherein the at least two floating-base phototransistors share the same common collector electrode.

2. A focal plane array (FPA) image sensor comprising the detector of claim 1.

3. The detector of claim 1, further comprising
at least a dielectric, each of the at least two PTs comprising an emitter, a collector, a floating base, a p-n junction positioned between the emitter and the base (E-B junction), and a p-n junction positioned between the base and the collector (B-C junction);
wherein the E-B junction is in direct contact only with and completely encapsulated only by the emitter, the base and the dielectric;
wherein the base is in direct contact only with and completely encapsulated only by the E-B junction, the B-C junction, and the dielectric; and
wherein the B-C junction is in direct contact only with and completely encapsulated only by a combination of the base, the collector and the dielectric.

4. The detector of claim 3, wherein a combination of the E-B junction, the base and the B-C junction is in direct contact only with and completely encapsulated only by a combination of the emitter, the collector and the dielectric.

5. The detector of claim 3, wherein the emitter of the first PT and the emitter of the second PT are separate from one another;
wherein the E-B junction of the first PT and the E-B junction of the second PT are separate from one another;
wherein the base of the first PT and the base of the second PT are separate from one another; and
wherein the B-C junction of the first PT and the B-C junction of the second PT are separate from one another.

6. The detector of claim 5, wherein the joined collector comprises a portion positioned between the B-C junction of the first PT and the B-C junction of the second PT.

7. The detector of claim 3, wherein an interface between the dielectric and a combination of the E-B junction, the base, and the B-C junction is planar.

8. The detector of claim 6, wherein an interface between the dielectric and a combination of the E-B junction, the base, and the B-C junction of the first PT, an interface between the dielectric and a combination of the E-B junction, the base, and the B-C junction of the second PT, and a surface of the portion of the joined collector are coplanar.

9. The detector of claim 3, wherein the dielectric comprises continuous portions.

10. The detector of claim 3, wherein the dielectric comprises discrete portions.

11. The detector of claim 3, wherein more than half of an atomic composition of the PTs is silicon.

12. The detector of claim 3, wherein more than half of an atomic composition of the PTs is Group III and Group V elements.

13. The detector of claim 6, wherein an electrically active doping level of the portion of the joined collector is higher than an electrically active doping level of the base.

14. The detector of claim 3, wherein the dielectric comprises an oxide or a nitride.

15. The detector of claim 3, wherein the dielectric comprises an amorphous material with a dielectric constant higher than a dielectric constant of silicon dioxide and is selected from the group consisting of $Al_2O_3$, $TiO_2$, $Ta_2O_5$, $HfO_2$, $HfSiO_4$, hafnium silicon oxynitride, $ZrO_2$, $ZrSiO_4$, $La_2O_3$ and combinations thereof.

16. The detector of claim 3, wherein the dielectric comprises at least two distinct layers.

17. An image sensor comprising the detector of claim 3.

* * * * *